(12) United States Patent
Feng et al.

(10) Patent No.: US 7,952,209 B2
(45) Date of Patent: May 31, 2011

(54) INTEGRATED CIRCUIT PACKAGE SYSTEM WITH PAD TO PAD BONDING

(75) Inventors: Po Yu Feng, Chiung Lin (TW); Cheng Yu Hsia, Chiung Lin (TW)

(73) Assignee: Stats Chippac Ltd., Singapore (SG)

( * ) Notice: Subject to any disclaimer, the term of this patent is extended or adjusted under 35 U.S.C. 154(b) by 728 days.

(21) Appl. No.: 11/536,242

(22) Filed: Sep. 28, 2006

(65) Prior Publication Data

US 2008/0079173 A1  Apr. 3, 2008

(51) Int. Cl.
*H01L 23/48* (2006.01)
(52) U.S. Cl. ........ 257/780; 257/734; 257/774; 257/777; 257/784; 257/E23.02; 257/E23.021
(58) Field of Classification Search .................. 257/738, 257/737, 786, 772–784; 228/180.22, 180.5; 438/613–617, 106, 125
See application file for complete search history.

(56) References Cited

U.S. PATENT DOCUMENTS

| | | | |
|---|---|---|---|
| 5,559,054 A | 9/1996 | Adamjee | |
| 6,215,182 B1 * | 4/2001 | Ozawa et al. | 257/723 |
| 6,380,635 B1 * | 4/2002 | Manning et al. | 257/784 |
| 6,476,506 B1 * | 11/2002 | O'Connor et al. | 257/786 |
| 6,511,865 B1 | 1/2003 | Lin | |
| 6,561,411 B2 | 5/2003 | Lee | |
| 6,863,208 B2 | 3/2005 | Lee | |
| 6,933,223 B1 | 8/2005 | Soon et al. | |
| 7,064,434 B2 * | 6/2006 | Lam et al. | 257/738 |
| 7,566,970 B2 | 7/2009 | Hung | |
| 2006/0022317 A1 * | 2/2006 | Liu et al. | 257/676 |

* cited by examiner

*Primary Examiner* — Jasmine J Clark
(74) *Attorney, Agent, or Firm* — Mikio Ishimaru

(57) ABSTRACT

An integrated circuit package system includes an integrated circuit die, a first controlled bump over the integrated circuit die, a second controlled bump over the integrated circuit die, and a connector between the first controlled bump and the second controlled bump.

17 Claims, 4 Drawing Sheets

INTEGRATED CIRCUIT PACKAGE SYSTEM WITH PAD TO PAD BONDING

TECHNICAL FIELD

The present invention relates generally to integrated circuit systems, and more particularly to a system for integrated circuit package with bonding.

BACKGROUND ART

Increasing demand across virtually all aspects of modern life drives integrated circuit technology. Demands for smaller, cheaper, faster, include packaging of integrated circuits. In general, an electronic package is defined as the housing and interconnection of integrated circuits, also referred to as 'semiconductor device', 'chip' or 'die', to form an electronic system. The package should provide a structure physically supporting the chip and protecting the chip from the environment, a means for removing heat generated by the chips or system, and/or electrical connections to provide signal and power access to and from the chip.

Wire bonding technology is a technique used to make electrical connections within the package. Wire bonding may employ gold, aluminum, or copper wires. A wire is bonded at one end to the integrated circuit and at the other end to a next-level system such as a substrate, a lead frame, a printed circuit board, a ceramic substrate, or a flexible circuit board.

A technique of wire bonding is to form a ball bond on the chip and a stitch bond on the substrate. A ball is formed on a tail of the wire, which extends from the end of a capillary of a wire bonder, and is bonded to a bond pad of the chip under pressure by the capillary while heat and/or ultrasonic vibration are applied. After the ball bond is formed, a loop is formed in the wire by subsequent action of the capillary. The capillary deforms the wire against a bond position of the substrate, producing a wedge-shaped stitch bond. The cycle is then completed and the next ball bond can be formed.

The market trend continues to demand more functions in smaller form factors. Multi-functional device packaging requires finer bond pad pitches as well as pad-to-pad bonding capability. Finer pitches and pad-to-pad bonding face several serious issues including, wire damage and wire or ball shorts in pad-to-pad bonding. Wire bonding for pad-to-pad bonding is particularly difficult with bond pad pitches of 35 um or less. The finer pitches further exacerbate the formation of electrical shorts caused by smashed or deformed balls.

Across virtually all applications, there continues to be growing demand for increasing capacity and increasing performance of integrated circuit memory. The seemingly endless restrictions and requirements are no more visible than with products in our daily lives. Smaller and denser integrated circuits are expected in many portable electronic products as well as in many larger electronic systems. As the demand grows for smaller electronic products with more features, manufacturers are seeking ways to include more capacity within the same product dimensional form factors.

In order to solve these problems and promote pad-to-pad boning capability, we researched new technologies of assembly.

Thus, a need still remains for an integrated circuit package system to provide improved capacity and manufacturing yield within standard form factors. In view of the increasing demand for improved integrated circuits and particularly more capacity in small products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit die, forming a first controlled bump over an integrated circuit die, forming a second controlled bump near over the integrated circuit die, and attaching a connector between the first controlled bump and the second controlled bump.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
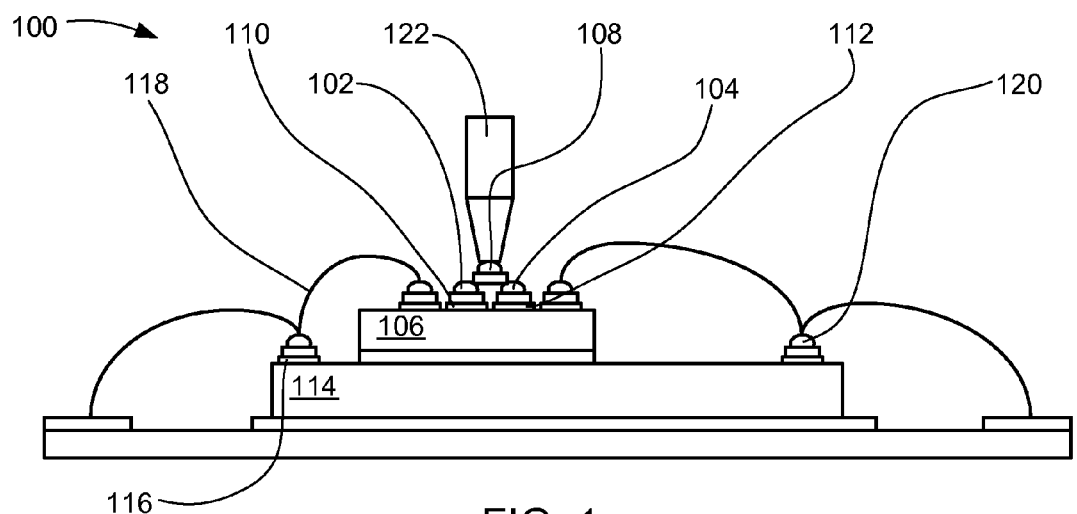
FIG. 1 is a side view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a side view of an integrated circuit package system 100 in an embodiment of the present invention. The integrated circuit package system 100 includes a first controlled bump 102, such as a wire bond bump, and a second controlled bump 104, such as a wire bond bump, over an integrated circuit die 106. A connector 108, such as a wire bond bump or a wire, connects the first controlled bump 102 to the second controlled bump 104. The first controlled bump 102 is formed over a first die connection site 110, such as a bond pad, and the second controlled bump 104 is formed over a second die connection site 112.

The connector 108 between the first controlled bump 102 and the second controlled bump 104 provides pad-to-pad bonding for the first die connection site 110 and the second die connection site 112, shown as ultra-fine pitch bond pads of 35 um or less. A capillary 122 is shown applying the connector 108. For illustrative purposes, the connector 108 is shown as a controlled bump similar to the first controlled bump 102 and the second controlled bump 104, although it is understood that the connector 108 may be of any type.

The integrated circuit die 106 can be stacked over a base integrated circuit 114. The base integrated circuit 114 can include base connection sites 116, such as ultra-fine pitch bond pads, and base connectors 118, such as wire bonds. The base connectors 118 attached to the base integrated circuit 114 can also include controlled bumps 120, such as the first controlled bump 102 and the second controlled bump 104. For illustrative purposes, the controlled bumps 120, the first controlled bump 102 and the second controlled bump 104, are shown over the base connection sites 116, although it is understood that the controlled bumps 120, the first controlled bump 102 and the second controlled bump 104, can be applied to any surface.

It has been discovered that the connector 108 between the first controlled bump 102 and the second controlled bump 104 eliminate damage of the connector 108 or the base connectors 118 by the capillary 122.

Figure 2:
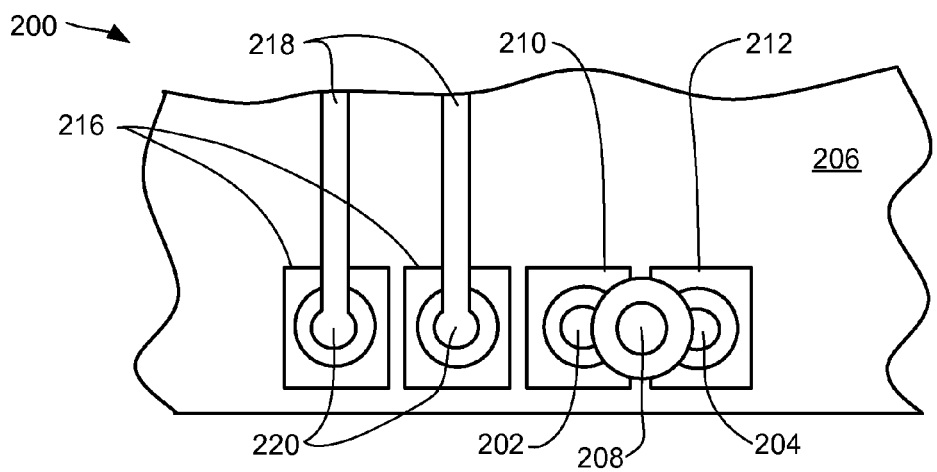
FIG. 2 is a top view of an integrated circuit package system in an alternative embodiment of the present invention.

Referring now to FIG. 2, therein is shown a top view of an integrated circuit package system 200 in an alternative embodiment of the present invention. Similar to the integrated circuit package system 100, the integrated circuit package system 200 includes a first controlled bump 202, such as a wire bond bump, and a second controlled bump 204, such as a wire bond bump over an integrated circuit die 206. A connector 208, such as a wire bond bump or a wire, connects the first controlled bump 202 to the second controlled bump 204. The first controlled bump 202 is formed over a first die connection site 210, such as a bond pad, and the second controlled bump 204 is formed over a second die connection site 212.

The connector 208 between the first controlled bump 202 and the second controlled bump 204 provides pad-to-pad bonding for the first die connection site 210 and the second die connection site 212, shown as ultra-fine pitch bond pads of 35 um or less. For illustrative purposes, the connector 208 is shown as a controlled bump similar to the first controlled bump 202 and the second controlled bump 204, although it is understood that the connector 208 may be of any type.

The integrated circuit package system 200 also includes additional connection sites 216, such as ultra-fine pitch bond pads, and extended connectors 218, such as wire bonds. The extended connectors 218 attached to the integrated circuit die 206 can also include controlled bumps 220, such as the first controlled bump 202 and the second controlled bump 204. For illustrative purposes, the controlled bumps 220, the first controlled bump 202 and the second controlled bump 204, are shown over the additional connection sites 216 although it is understood that the controlled bumps 220, the first controlled bump 202 and the second controlled bump 204, can be applied to any surface.

It has been discovered that the connector 208 between the first controlled bump 202 and the second controlled bump 204 eliminates wire shorting from a wire loop with pad-to-pad bonding on the first die connection site 210 and the second die connection site 212.

Figure 3:
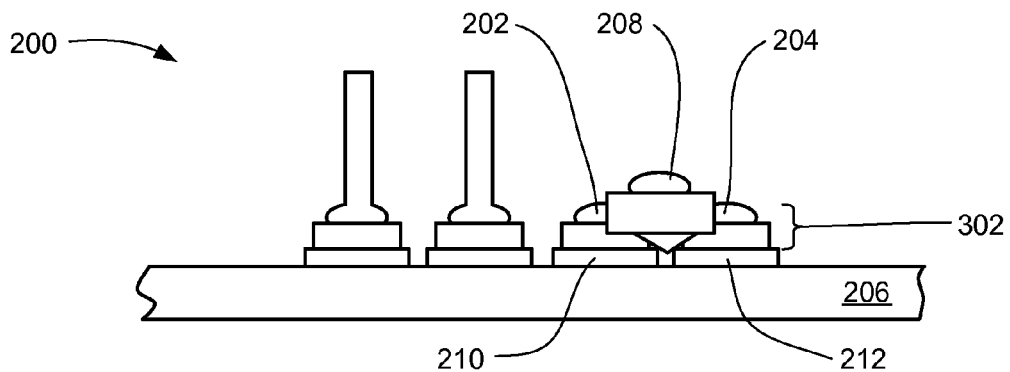
FIG. 3 is a side view of the integrated circuit package system.

Referring now to FIG. 3, therein is shown a side view of the integrated circuit package system 200. The integrated circuit package system 200 includes the first controlled bump 202 and the second controlled bump 204 over the first die connection site 210 and the second die connection site 212 respectively. The connector 208 covers a portion of both the first controlled bump 202 and the second controlled bump 204. Further, the connector 208 is formed between the first controlled bump 202 and the second controlled bump 204 to a depth 302. The depth 302 provides an electrical connection between the first controlled bump 202 and the second controlled bump 204 thereby connecting the first die connection site 210 and the second die connection site 212.

It has been discovered that the connector 208 with the first controlled bump 202 and the second controlled bump 204 provide signal integrity for the connection between the first die connection site 210 and the second die connection site 212.

Figure 4:
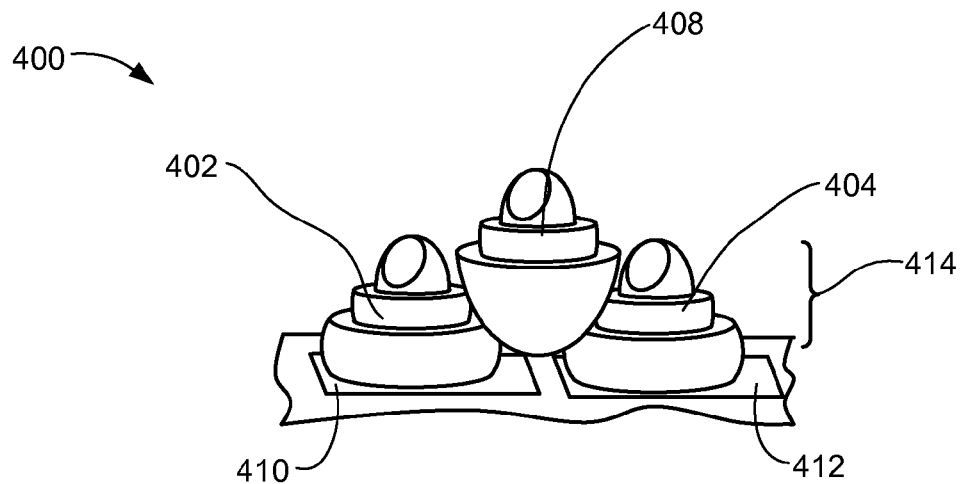
FIG. 4 is an isometric view of a bump-on-bump forming phase of an integrated circuit package system in another alternative embodiment of the present invention.

Referring now to FIG. 4, therein is shown an isometric view of a bump-on-bump forming phase of an integrated circuit package system 400 in another alternative embodiment of the present invention. Similar to the integrated circuit package system 200, the integrated circuit package system 400 includes a first controlled bump 402, such as a wire bond bump, a second controlled bump 404, such as a wire bond bump, and a connector 408, such as a wire bond bump or a wire.

The connector 408 forms a bump-on-bump with the first controlled bump 402 and the second controlled bump 404. The connector 408 is formed between the first controlled bump 402 and the second controlled bump 404 to a depth 414. The depth 414 provides an electrical connection between the first controlled bump 402 and the second controlled bump 404 thereby connecting a first die connection site 410 and a second die connection site 412.

It has been discovered that the first controlled bump 402 and the second controlled bump 404 provide structural integrity for forming the connector 408 between the first die connection site 410 and the second die connection site 412.

Figure 5:
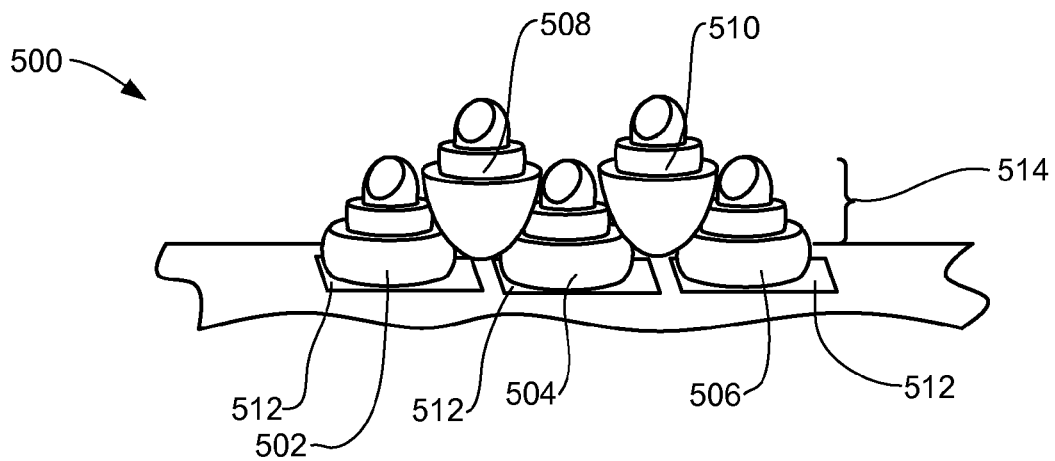
FIG. 5 is an isometric view of an integrated circuit package system in an alternative embodiment of the present invention.

Referring now to FIG. 5, therein is shown an isometric view of an integrated circuit package system 500 in an alternative embodiment of the present invention. Similar to the integrated circuit package system 400, the integrated circuit package system 500 includes a first controlled bump 502, such as a wire bond bump, a second controlled bump 504, such as a wire bond bump, and a third controlled bump 506, such as a wire bond bump. A first connector 508, such as a wire bond bump or a wire, connects the first controlled bump 502 and the second controlled bump 504. A second connector 510, such as a wire bond bump or a wire, connects the second controlled bump 504 and the third controlled bump 506.

The first connector 508 and the second connector 510 form a bump-on-bump with the first controlled bump 502, the second controlled bump 504, and the third controlled bump 506. The first connector 508 is formed between the first controlled bump 502 and the second controlled bump 504. The second connector 510 is formed between the second controlled bump 504 and the third controlled bump 506. A depth 514 provides electrical connection between the first controlled bump 502 and the second controlled bump 504 thereby connecting die connection sites 512. The depth 514 also provides electrical connection between the second controlled bump 504 and the third controlled bump 506 also connecting the die connection sites 512.

It has been discovered that the first controlled bump 502 and the second controlled bump 504 provide structural integrity for forming the first connector 508 between the first controlled bump 502 and the second controlled bump 504. Further, it has been discovered that the second controlled bump 504 and the third controlled bump 506 provide structural integrity for forming the second connector 510 between the second controlled bump 504 and the third controlled bump 506.

Figure 6:
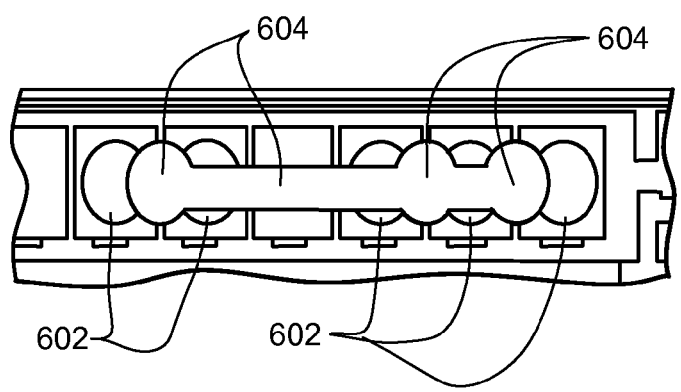
FIG. 6 is a top view of an integrated circuit package system in another alternative embodiment of the present invention.

Referring now to FIG. 6, therein is shown a top view of an integrated circuit package system 600 in another alternative embodiment of the present invention. The integrated circuit package system 600 includes controlled bumps 602, such as wire bond bumps. The controlled bumps 602 are connected by connectors 604, such as wire bond bumps or wires. Some of the connectors 604 are shown as wire bond bumps that can optionally be formed as the controlled bumps 602. Others of the connectors 604 are shown as wires that can be formed with the wire bond bumps. For illustrative purposes, two of the controlled bumps 602 are connected to one another and connected to three others of the controlled bumps 602, although it is understood that any combination may be connected.

It has been discovered that the controlled bumps 602 and the connectors 604 provide improved workability, quality and yield while utilizing existing equipment and technology for forming the controlled bumps 602 and the connectors 604.

Figure 7:
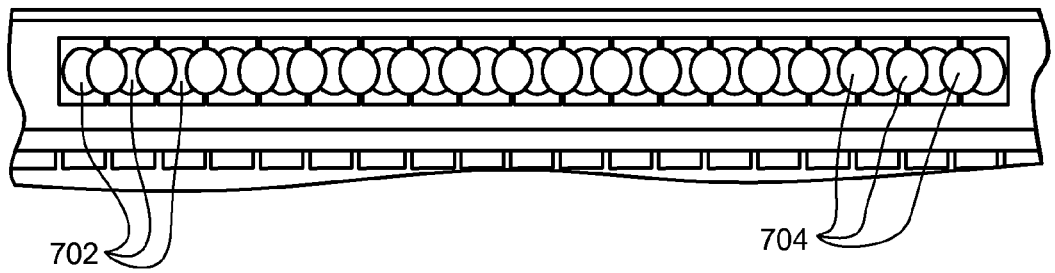
FIG. 7 is a top view of an integrated circuit package system in yet another alternative embodiment of the present invention.

Referring now to FIG. 7, therein is shown a top view of an integrated circuit package system 700 in yet another alternative embodiment of the present invention. The integrated circuit package system 700 includes controlled bumps 702, such as wire bond bumps. The controlled bumps 702 are connected by connectors 704, such as wire bond bumps. The connectors 704 are shown as wire bond bumps that can optionally be formed as the controlled bumps 702. For illustrative purposes, nineteen of the controlled bumps 702 are shown connected by eighteen of the connectors 704, although it is understood that any number of the controlled bumps 702 or the connectors 704 may be used.

It has been discovered that the controlled bumps 702 and the connectors 704 are compatible with ball grid arrays, lead frame packages, land grid arrays, circuit board packages, system in a package, system on a chip and package to package stacking.

Figure 8:
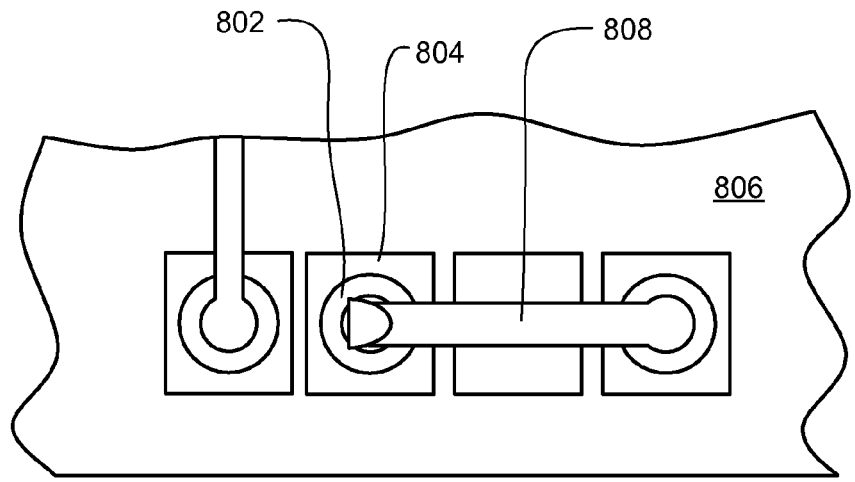
FIG. 8 is a top view of an integrated circuit package system in yet another alternative embodiment of the present invention.

Referring now to FIG. 8, therein is shown a top view of an integrated circuit package system 800 in yet another alternative embodiment of the present invention. The integrated circuit package system 800 includes a controlled bump 802. The controlled bump 802 provides planar dimensions equal to or smaller than planar dimensions of a connection site 804, such as an ultra-fine pitch bond pad, of an integrated circuit die 806. A connector 808, such as a bond wire, connects two or more of the connection site 804 of the integrated circuit die 806. The connector 808 can be formed with the controlled bump 802.

The controlled bump 802 is formed with a process, such as a standoff stitch bonding or reverse-bonded standoff stitch bonding. The process includes a special recipe of control factors such as ultrasonic generator current, bond time, bond force. The controlled bump 802 is formed with an ultrasonic generator current of approximately two milliamperes, a bond time of approximately two milliseconds, and a force of approximately two gram force.

It has been unexpectedly discovered that the special recipe, using control factors at a range not believed to be possible for wire bond ball formation, provides structural integrity for planar dimensions of the controlled bump 802 equal to or smaller than planar dimensions of the connection site 804.

Figure 9:
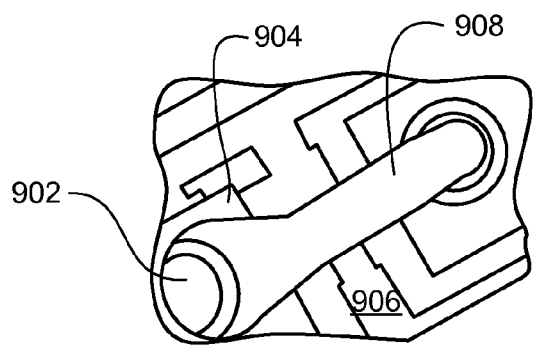
FIG. 9 is a top view of an integrated circuit package system in yet another alternative embodiment of the present invention.

Referring now to FIG. 9, therein is shown a top view of an integrated circuit package system 900 in yet another alternative embodiment of the present invention. The integrated circuit package system 900 includes a controlled bump 902. The controlled bump 902 provides planar dimensions equal to or smaller than planar dimensions of a connection site 904, such as an ultra-fine pitch bond pad, of an integrated circuit die 906. A connector 908, such as a bond wire, connects two or more of the connection site 904 of the integrated circuit die 906. The connector 908 can be formed with the controlled bump 902.

It has been discovered that the controlled bump 902 and the connector 908 eliminate wire shorting from wire loops reducing the need for less flexible wires such as gold thereby resulting in significant cost savings.

For illustrative purposes, the connector 908 is shown connecting two adjacent of the connection site 904, although it is understood that the connector 908 may connect any location or number of the connection site 904.

Figure 10:
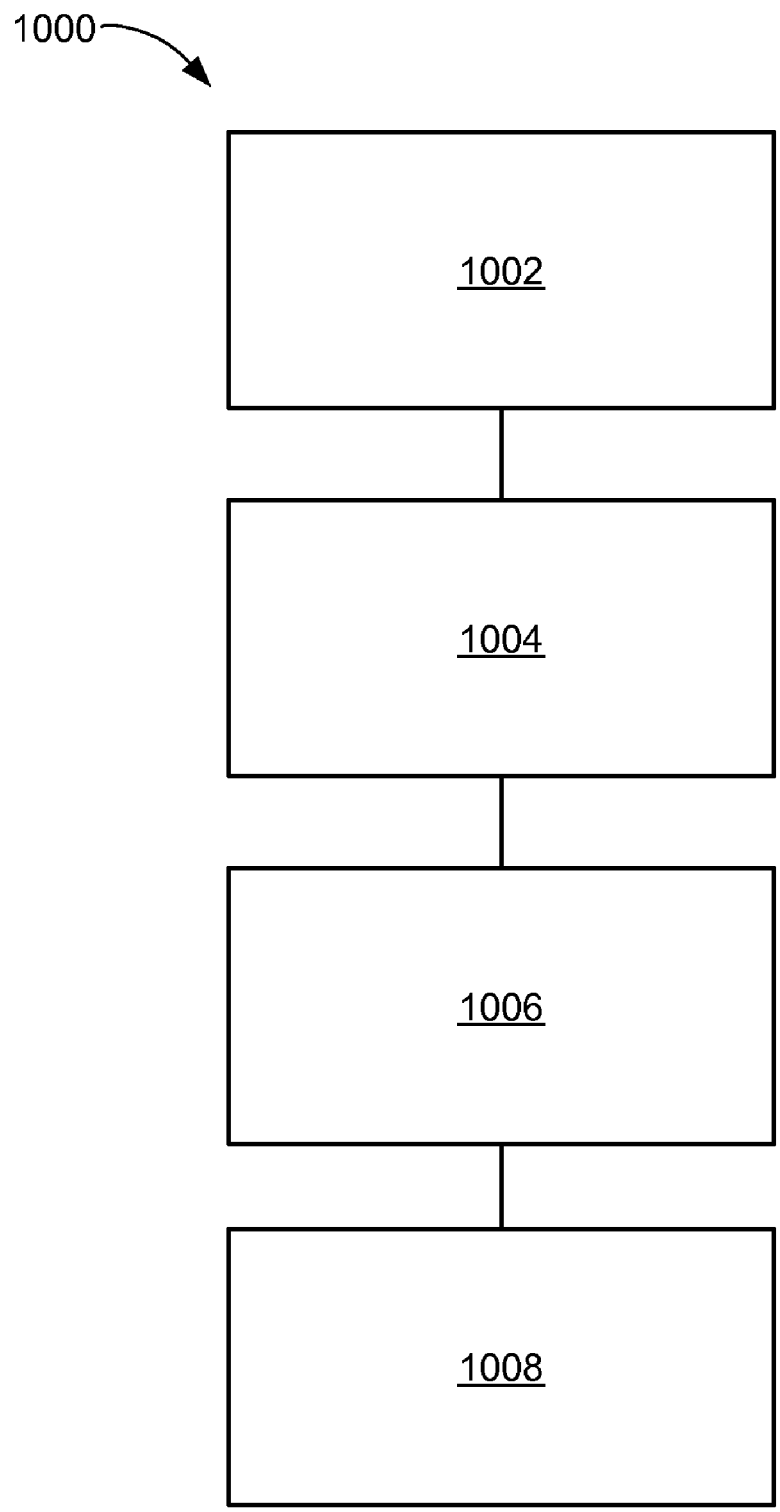
FIG. 10 is a flow chart of an integrated circuit package system for manufacturing the integrated circuit package system 100 in an embodiment of the present invention.

Referring now to FIG. 10, therein is shown a flow chart of an integrated circuit package system 1000 for manufacturing the integrated circuit package system 100 in an embodiment of the present invention. The system 1000 includes providing an integrated circuit die in a block 1002; forming a first controlled bump over an integrated circuit die in a block 1004; forming a second controlled bump near over the integrated circuit die in a block 1006; and attaching a connector between the first controlled bump and the second controlled bump in a block 1008.

In greater detail, a method to fabricate the integrated circuit package system 100, in an embodiment of the present invention, is performed as follows:
1. Providing an integrated circuit die having a first die connection site adjacent to a second die connection site. (FIG. 1)
2. Forming a first controlled bump on a first die connection site. (FIG. 1)
3. Forming a second controlled bump on a second die connection site adjacent to the first die connection site. (FIG. 1)
4. Attaching a bump on the first controlled bump and the second controlled bump. (FIG. 1)

It has been discovered that the present invention thus has numerous aspects.

An aspect is that the present invention provides the bump-on-bump (BOB) connection. The bump-on-bump connection includes the wire bond bump attached over another wire bond bump. More than one of the wire bond bump can be attached to form the electrical connection between the integrated circuit and the integrated circuit package system.

Another aspect is that the present invention provides the controlled bump. The controlled bump is formed with control factors such as, current, bond time, and force. The current is approximately 2 mA, the bond time is approximately 2 ms, and the force is approximately 2 gf.

Yet another aspect is that the present invention provides standoff stitch bonding. Standoff stitch bonding including reverse-bonded standoff stitch bonding is formed between connection sites including the integrated circuit die, other integrated circuit dice, and packages.

It has been discovered that the disclosed structure eliminates wire damage from a capillary with pad-to-pad bonding on adjacent bond pads. Fine pitch bond pads of 35 um or less are particularly susceptible to wire damage.

It has also been discovered that the disclosed structure eliminates wire shorting from a wire loop with pad-to-pad bonding on adjacent bond pads. Fine pitch bond pads of 35 um or less exacerbate the wire loop particularly with pad-to-pad bonding.

Yet another discovery is that that the disclosed structure eliminates signal shorting from wire bond bumps extending beyond the connection site, such as a bond pad, to an adjacent connection site.

Yet another discovery is that the disclosed structure utilizes current wire bonding equipment. No additional investments in equipment are required for implementation, so the cost basis remains unchanged.

Yet another discovery is that the disclosed structure improves workability, quality, and yield. Significant cost savings and improvement in the cost per unit result from the manufacturing improvements as well as the unchanged cost basis.

Yet another discovery of the disclosed structure is reduced gold wire usage. Eliminating wire shorting from wire loops reduces the need for less flexible wires such as gold. This results in significant cost reductions.

Yet another discovery of the disclosed structure is compatibility with BGA, lead frame packages, LGA, circuit board packages, SiP, SoC, and package to package stacking. Broad usage across many package types provides benefits to multiple applications.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
providing an integrated circuit die;
forming a first controlled bump over the integrated circuit die wherein forming the first controlled bump includes forming a wire bond bump;
forming a second controlled bump over the integrated circuit die; and
attaching a connector between the first controlled bump and the second controlled bump, the connector having a wire bond bump on the first controlled bump and the second controlled bump.

2. The system as claimed in claim 1 wherein forming the second controlled bump includes forming a wire bond bump.

3. The system as claimed in claim 1 wherein attaching the connector includes forming a wire between the first controlled bump and the second controlled bump.

4. The system as claimed in claim 1 further comprising:
forming a third controlled bump;
forming a fourth controlled bump adjacent to the third controlled bump;
attaching a bump on the third controlled bump and the fourth controlled bump; and
connecting a wire between the bump and the connector between the first controlled bump and the second controlled bump.

5. An integrated circuit package system comprising:
providing an integrated circuit die having a first die connection site adjacent to a second die connection site;
forming a first controlled bump on the first die connection site;
forming a second controlled bump on the second die connection site; and
attaching a wire bond bump on the first controlled bump, the second controlled bump.

6. The system as claimed in claim 5 wherein forming the first controlled bump includes forming the first controlled bump with a special recipe controlling ultrasonic generator current to about two milliamperes.

7. The system as claimed in claim 5 wherein forming the first controlled bump includes forming the first controlled bump with a special recipe controlling bond time to about two milliseconds.

8. The system as claimed in claim 5 wherein forming the first controlled bump includes forming the first controlled bump with a special recipe controlling bond force to about two gram force.

9. An integrated circuit package system comprising:
an integrated circuit die;
a first controlled bump over the integrated circuit die wherein the first controlled bump is a wire bond bump;
a second controlled bump over the integrated circuit die; and
a connector between the first controlled bump and the second controlled bump, the connector having a wire bond bump on the first controlled bump and the second controlled bump.

10. The system as claimed in claim 9 wherein the second controlled bump is a wire bond bump.

11. The system as claimed in claim 9 wherein the connector is a wire between the first controlled bump and the second controlled bump.

12. The system as claimed in claim 9 further comprising:
a third controlled bump;
a fourth controlled bump;
a bump on the third controlled bump and the fourth controlled bump; and a wire between the bump and the connector between the first controlled bump and the second controlled bump.

13. The system as claimed in claim 9 wherein:
the integrated circuit die has a first die connection site adjacent to a second die connection site;
the first controlled bump is on the first die connection site;
the second controlled bump is on the second die connection site; and
the connector is a wire bond bump on the first controlled bump and the second controlled bump.

14. The system as claimed in claim 13 wherein the wire bond bump is a third controlled bump.

15. The system as claimed in claim 13 wherein the first controlled bump includes planar dimensions of the first controlled bump less than or equal to planar dimensions of the first die connection site.

16. The system as claimed in claim 13 wherein the second controlled bump includes planar dimensions of the second controlled bump less than or equal to planar dimensions of the adjacent connection site.

17. The system as claimed in claim 13 further comprising a base integrated circuit connected to the integrated circuit die with base connectors.

* * * * *